(12) United States Patent
Doblar et al.

(10) Patent No.: US 6,516,422 B1
(45) Date of Patent: Feb. 4, 2003

(54) COMPUTER SYSTEM INCLUDING MULTIPLE CLOCK SOURCES AND FAILOVER SWITCHING

(75) Inventors: Drew G. Doblar, San Jose; Leo Yuan, Los Altos; Emrys J. Williams, Sunnyvale, all of CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/320,794

(22) Filed: May 27, 1999

(51) Int. Cl.$^7$ ................................................ G06F 11/00
(52) U.S. Cl. ........................ 713/503; 713/500; 327/295; 395/180
(58) Field of Search ................................ 713/500, 503; 327/295; 395/180

(56) References Cited

U.S. PATENT DOCUMENTS

| | | | |
|---|---|---|---|
| 4,025,874 A | | 5/1977 | Abbey .......................... 331/55 |
| 4,282,493 A | | 8/1981 | Moreau .......................... 331/2 |
| 4,511,859 A | | 4/1985 | Dombrowski ................. 331/11 |
| 5,416,443 A | * | 5/1995 | Cranford, Jr. et al. .......... 331/2 |
| 5,422,915 A | * | 6/1995 | Byers et al. ................. 375/357 |
| 5,515,403 A | | 5/1996 | Sloan et al. ................. 375/371 |
| 5,523,708 A | * | 6/1996 | Yamasaki .................... 327/20 |
| 5,530,726 A | | 6/1996 | Ohno .......................... 375/357 |
| 5,648,964 A | | 7/1997 | Inagaki et al. ............... 370/228 |
| 5,774,705 A | * | 6/1998 | Leshem ....................... 395/556 |
| 5,852,728 A | * | 12/1998 | Matsuda et al. ............. 395/556 |
| 5,883,533 A | | 3/1999 | Matsuda et al. ............. 327/156 |
| 5,969,558 A | | 10/1999 | Abe ............................ 327/292 |
| 6,194,969 B1 | | 2/2001 | Doblar ........................... 331/2 |

OTHER PUBLICATIONS

International Search Report, Application No. PCT/US 00/13442, mailed Oct. 6, 2000.

Motorola, Inc., Semiconductor Technical Data, "Dynamic Switch PLL Clock Driver," Sep. 1997, pp. 1–6.

"Synchronization Between DMS Exchanges", Probert, Northern Telecom Canada Ltd., ISS 81 CIC Montreal 21–25 Sep. 1981.

\* cited by examiner

*Primary Examiner*—Jeffrey Gaffin
*Assistant Examiner*—Harold Kim
(74) *Attorney, Agent, or Firm*—Meyertons Hood Kivlin Kowert & Goetzel, P.C.; B. Noël Kivlin

(57) ABSTRACT

A system and method for providing redundant, synchronized clocks in a computer system. Upon a failure of a master clock signal, the system switches over to a slave clock signal synchronized with the master clock signal. Switching logic is coupled to receive a first clock signal and a second clock signal. The switching logic selects either the first clock signal or the second clock signal as a local clock signal. The switching logic further monitors the first clock signal for a failure. If a failure is monitored, the switching logic accepts the second clock signal as the local clock signal in place of the first clock signal. One or more clock local loads operate according to the local clock signal. The switching logic may control the input to a phase locked loop (PLL) that provides the local clock signal to the local clock loads. The method includes a PLL synchronizing an output clock signal with the master clock signal. The output clock signal is used by at least one local clock load for timing. The switching logic monitors the master clock signal and the slave clock signal for a failure. Upon a failure of either the master clock signal or the slave clock signal, the switching logic notifies a system controller of the failure. Upon the failure of the first clock signal, the switching logic switches the second clock signal in place of the first clock signal as the master clock signal for the PLL, causes the second clock signal to fail-over and to take over as the master clock source to the PLL, and causes the second clock source to provide a reference control signal to the second clock source. Clock switching is automatic and does not interrupt or interfere with operation of the computer system.

14 Claims, 7 Drawing Sheets

COMPUTER SYSTEM INCLUDING MULTIPLE CLOCK SOURCES AND FAILOVER SWITCHING

FIELD OF THE INVENTION

This invention relates to timing in electronic systems, and, more particularly, to systems employing redundant, synchronous clock distribution.

DESCRIPTION OF THE RELATED ART

The need to generate a local signal which is synchronized with an external reference signal is critical in many electronics applications such as frequency synthesis, clock recovery, clock generation and frequency demodulation. This coherence between the reference signal and the local replica is referred to as "phase synchronization". This implies either that local signal is typically either in phase with the external reference signal or is offset from the reference signal by some phase constant.

At the heart of many such synchronization circuits is some form of a phase locked loop (PLL). Phase-locked loops are feedback control loops, whose controlled parameter is the phase of a locally generated replica of an incoming reference signal. Phase-locked loops have three basic components: a phase detector, a loop filter, and a voltage-controlled oscillator.

Generally speaking, electronic systems such as computer systems produce a master clocking signal from a crystal. The master clocking signal may be fed into a PLL to produce many identical clock signals (e.g. fanout) that are used to synchronize the components of the computer system.

The master clock signal is a critical component of the computer system. The failure of the master clock signal may disable the entire system. Thus, to alleviate this problem, some systems incorporate two master clock signals, one of which is redundant. Upon a failure of the first master clock signal, the system is shut down and may be reinitialized using the second master clock signal. However, such a requirement disrupts system operation. Accordingly, it would be desirable to provide a system that can fail-over from one clock source to another clock source without causing a disruption to system operations.

SUMMARY OF THE INVENTION

The problems outlined above are in large part solved by a system and method for providing redundant, synchronized clocks in a computer system. Upon a failure of a master clock signal, the system switches over to a slave clock signal synchronized with the master clock signal. In one embodiment, switching logic is coupled to receive a first clock signal and a second clock signal. The switching logic is configured to select either the first clock signal or the second clock signal as a local clock signal. The switching logic is further configured to monitor the first clock signal for a failure. If a failure of the first clock signal is monitored, the switching logic is further configured to accept the second clock signal as the local clock signal in place of the first clock signal. The system also includes one or more clock local loads that operate according to the local clock signal. In another embodiment, the switching logic controls the input to a phase lock loop that provides the local clock signal to the local clock loads. This configuration may advantageously allow a redundant, synchronous slave clock to replace a master clock upon failure of the master clock.

In a further embodiment, the first clock source is incorporated on a first clock board, and the second clock source is incorporated on a second clock board. The system further includes, in this embodiment, a system board, and a system controller. The system board. is coupled to receive both the first clock signal and the second clock signal. The system board is configured to selectively use either the first clock signal or the second clock signal as a local clock signal. The system controller is coupled to the first clock board, the second clock board, and the system board. The system controller is configured to monitor both the first clock signal and the second clock signal for a failure. The first clock board may be removed from the system, such as upon a failure, and a third clock board placed in the system in place of the first clock board. The second clock board is switched from being the slave clock source to the master clock source. The third clock board is configured to operate as the slave clock source upon being placed in the system. The removable clock board may advantageously result in higher uptime for the system as a failed clock board may be replaced while the system is in use.

A method is likewise contemplated for providing redundant, synchronous clock signals. The method comprises, in one embodiment, a first clock source providing a first clock signal as a master clock signal to a phase locked loop (PLL). A second clock source provides a second clock signal as a slave clock signal to the PLL, where the slave clock signal is synchronized with the master clock signal. The PLL synchronizes an output clock signal with the master clock signal. The output clock signal is used by at least one local clock load for timing. The switching logic monitors the master clock signal and the slave clock signal for a failure. Upon a failure of either the master clock signal or the slave clock signal, the switching logic notifies a system controller of the failure. Upon the failure of the first clock signal, the switching logic switches the second clock signal in place of the first clock signal as the master clock signal for the PLL. Also upon receiving notice of the failure of the first clock signal, the system controller causes the second clock signal to fail-over and to take over as the master clock source to the PLL. Upon receiving notice of the failure of the first clock signal, the system controller further causes the second clock source to provide a reference control signal to the second clock source. The method may advantageously maintain continuous operation of the computer system while switching between clock sources.

In preferred embodiments, clock switching from a failed master clock to a redundant slave clock is automatic and does not interrupt or interfere with the operations of the computer system. No halt and restart are necessary. The clock change is transparent to the local clock loads using the local clock signal.

BRIEF DESCRIPTION OF THE DRAWINGS

Other objects and advantages of the invention will become apparent upon reading the following detailed description and upon reference to the accompanying drawings in which.

Figure 1:
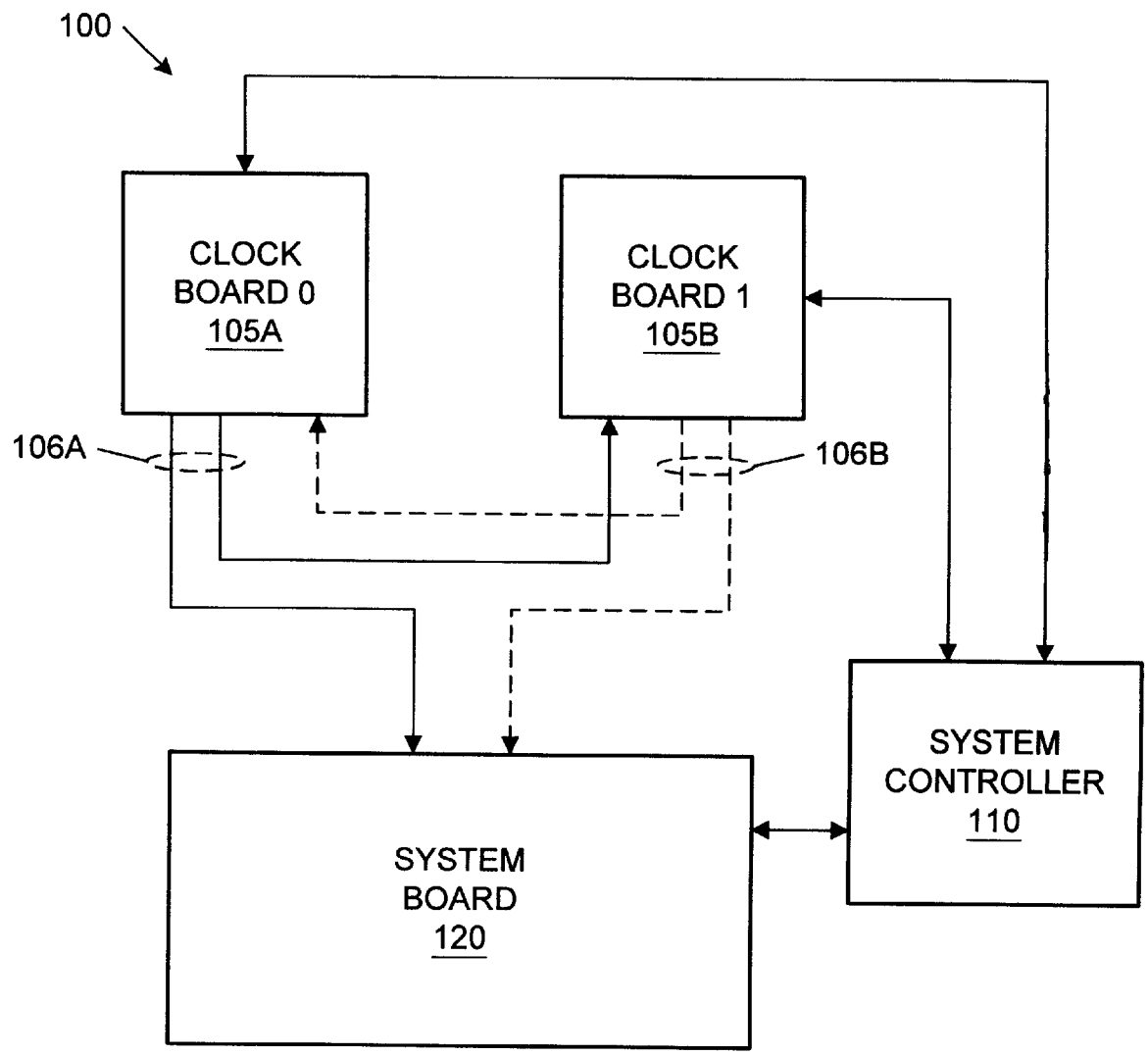
FIG. 1 is a block diagram of an embodiment of a generalized computer system including two clock boards and a system board.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1—Generalized Computer System

Turning to FIG. 1, a block diagram of an embodiment of a generalized computer system 100 is shown. A first clock source, shown as clock board-0 105A, provides a first clock signal 106A to clock board 1 105B and to system board 120. Clock board-1 105B is illustrated as a second clock source, which provides a second clock signal 106B to clock board-0 105A and to the system board 120. A system controller 110 is coupled to the two clock boards 105A and 105B as well as to the system board 120.

As is described below in more detail, the system board 120 receives both the first clock signal 106A and the second clock signal 106B. The first clock signal 106A and the second clock signal 106B are preferably in phase on a rising edge, phase and frequency locked, although the frequencies of each clock signal 106A and 106B may differ by an integer multiple. Upon a failure of one of the clock signals 106A or 106B, which is currently serving as the master clock signal, the system controller 110 switches in the other clock signal, 106A, 106B, previously serving as the slave clock signal, as the new master clock signal. Thus, the slave clock signal, perhaps from clock board-1 105B, takes over as the master clock signal, such as when clock board-0 105A fails to provide the expected master clock signal 106A.

It is noted that system controller 110 or parts thereof may be incorporated on any of clock board-0 105A, clock board-1 105B, system board 120, or any other board or component of computer system 100, as desired. In the embodiments illustrated in FIGS. 2–5, a portion of the system controller 10 may be comprised on each board shown, even when not expressly illustrated. A portion of system controller 110 may be included in each select PLL 300, as described below with respect to FIG. 3.

Figure 2:
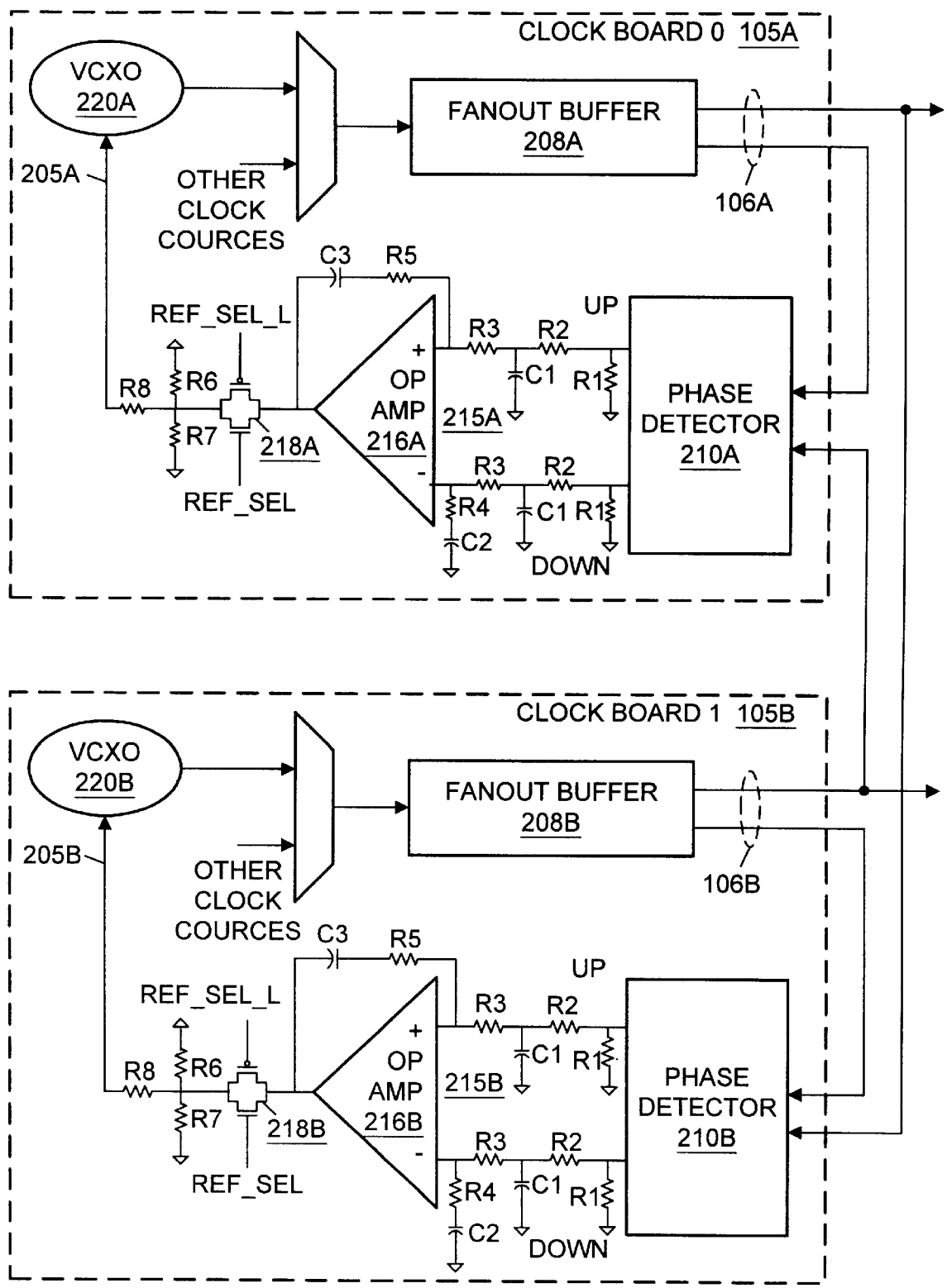
FIG. 2 is a block diagram of an embodiment of the clock boards of FIG. 1.

FIG. 2—Clock Boards and Clock Signals

Turning now to FIG. 2, an embodiment of two clock boards 105A and 105B and the coupling of their respective clock signals 106A and 106B are illustrated. Clock board-0 105A includes a voltage controlled crystal oscillator (VCXO) 220A coupled to receive a control signal 205A. As illustrated, the source of the control signal 205A is determined by a switch 218A. When the switch 218A is in the master position (off, in this case), making clock board-0 105A the master clock source, the source of the control signal 205A is preferably a fixed reference voltage. In one embodiment, the fixed reference voltage generated is a voltage within the operating voltage range of the VCXO 220A, wherein the control voltage causes the VCXO 220A to generate a reference output frequency, such as, for example, 75 MHz. In a preferred embodiment, the operating voltage range is from 0–3.30 V, and the fixed reference voltage is 1.65 V.

The frequency output of the VCXO 220A is preferably one of several clock inputs that may be multiplexed into the circuit. The selected output of the multiplexer is provided to a fanout buffer 208A. Fanout buffer 208A outputs a plurality of clock signals 106A for various destinations, such as for clocking on clock board-0 105A, clock board-1 105B, system board 120, or other boards, components, etc. of computer system 100. As noted, other clock sources may also be provided to the multiplexer. Examples of other clock sources include VCXOs with differing operating frequency ranges, fixed frequency sources, other VCOs, etc.

Clock board-0 105A may also include a phase detector 210A coupled to receive one of the clock signals 106A from the fanout buffer 208A. The phase detector 210A is also coupled to receive another clock signal, such as clock signal 106B, as shown. The phase detector 210A outputs a phase error signal in response to receiving the two clock signals 106A and 106B. In the embodiment illustrated, the phase error signal is output as an UP signal and/or a DOWN signal, reflecting the phase of the first input clock signal being behind or ahead of the second input clock signal. The phase error signal is filtered by an active filter 215A formed collectively in the illustrated embodiment by a network of resistances R1–R5, capacitances C1–C3, and an operational amplifier 216A. The filter 215A preferably acts as a low pass filter and integrator of the UP and DOWN pulses from the phase detector 210A.

The output of the filter 215A may be presented to the switch 218A. In the open, or master position, the feedback dependent signal from the phase detector 210A and the filter 215A are not provided to the VCXO 220A. Instead, a constant voltage, such as established by a voltage divider formed by resistors R6 and R7, is provided to control the VCXO 220A.

When the switch 218A is in the slave, or closed, position, the output of the filter 215A is presented to the switch 218A. It is noted that the drive associated with the filter 215A, when the switch 218A is closed, is sufficient to overdrive the constant control voltage established by the resistors R6 and R7. In the illustrated embodiment, the switch 218A is a passgate, implemented using a pair of field effect transistors. Other embodiments of the switch 218A are contemplated where the signal from the filter 215A selectively controls the VCXO 220A, along with an alternative source for the control signal 205A. For example, one embodiment of switch 218A selects between the output of the filter 215A and a power supply voltage as the control voltage 205A.

The switch 218A is controlled by the reference select signals, REF_SEL and a REF_SEL_L, a pair of complementary control signals. In one embodiment, the controller 110 generates the reference select signals.

In a preferred embodiment, clock board-1 105B and clock board-0 105A are duplicates of each other and interchangeable, capable of operating in a similar manner. In this embodiment, with clock board-0 105A acting as a master clock source with the output of the VCXO 220A at a fixed frequency, clock board-1 105B acts as a slave clock source. The master clock 106A is fed into phase detector 210B as the reference clock, with the output of clock board-1 105B also input into phase detector 210B as the feedback clock. With switch 218B in the slave position, the circuit shown on clock board-1 105B functions as a PLL. Clock signal 106B is continually phase aligned with clock signal 106A.

As will be described below with reference to FIG. 3, each board (e.g. clock boards 105A and 105B, system board 120, etc.) in computer system 100 may include one or more select PLLs 300 coupled to receive both the master clock signal 106A and the slave clock signal 106B. Each select PLL 300 is further configured to output clock signals for local use by local clock loads at frequencies that are fractions or multiples of the master clock frequency, including a multiplier of one.

In various embodiments, upon a failure of the master clock source, the system controller 110 determines and/or is notified of the failure. The system controller 110 then switches the slave clock source over to function as the new master clock source. The system controller 110 may also notify the computer system 100, e.g. the computer user via a display, that the master clock source has failed. The failed clock source, e.g. a clock board, may be replaced without interrupting or interfering with the operations of the computer system 100. Clock switching thus occurs automatically and "on the fly". Preferably, the change in the clock source is transparent to the synchronous logic relying on the clock source. Once a replacement clock board has been added to the computer system 100, the system controller 110 preferably switches the replacement clock board into slave mode, to provide a new phase-aligned redundant clock source.

It is noted that failure of a clock signal may be due to many causes, such as clock source failure, wiring or connection failure, etc. The cause of the clock signal failure is less important than the knowledge that the clock signal is not correctly propagating through the system. It is also noted that in various embodiments, the VCXO 220 may be any type of VCO 220.

In an embodiment in which VCXOs 220A and 220B are used, the relatively small operating frequency range of a VCXO, compared to a conventional VCO, may provide for advantageous operation. Upon the loss of the input clock signal 106A, the output of the VCXO 220B will only fall in frequency by a relatively small amount, such as 200 PPM. When the slave VCXO 220B fails-over to become the master clock source, the VCXO 220B input will be a step function increase or decrease in frequency due to switching in the constant control voltage described above. The VCXO 220B preferably limits the rate of change of the frequency to within the operating response range of the select PLLs 300 and other downstream local clock loads 350, both discussed in FIG. 3 below.

Figure 3:
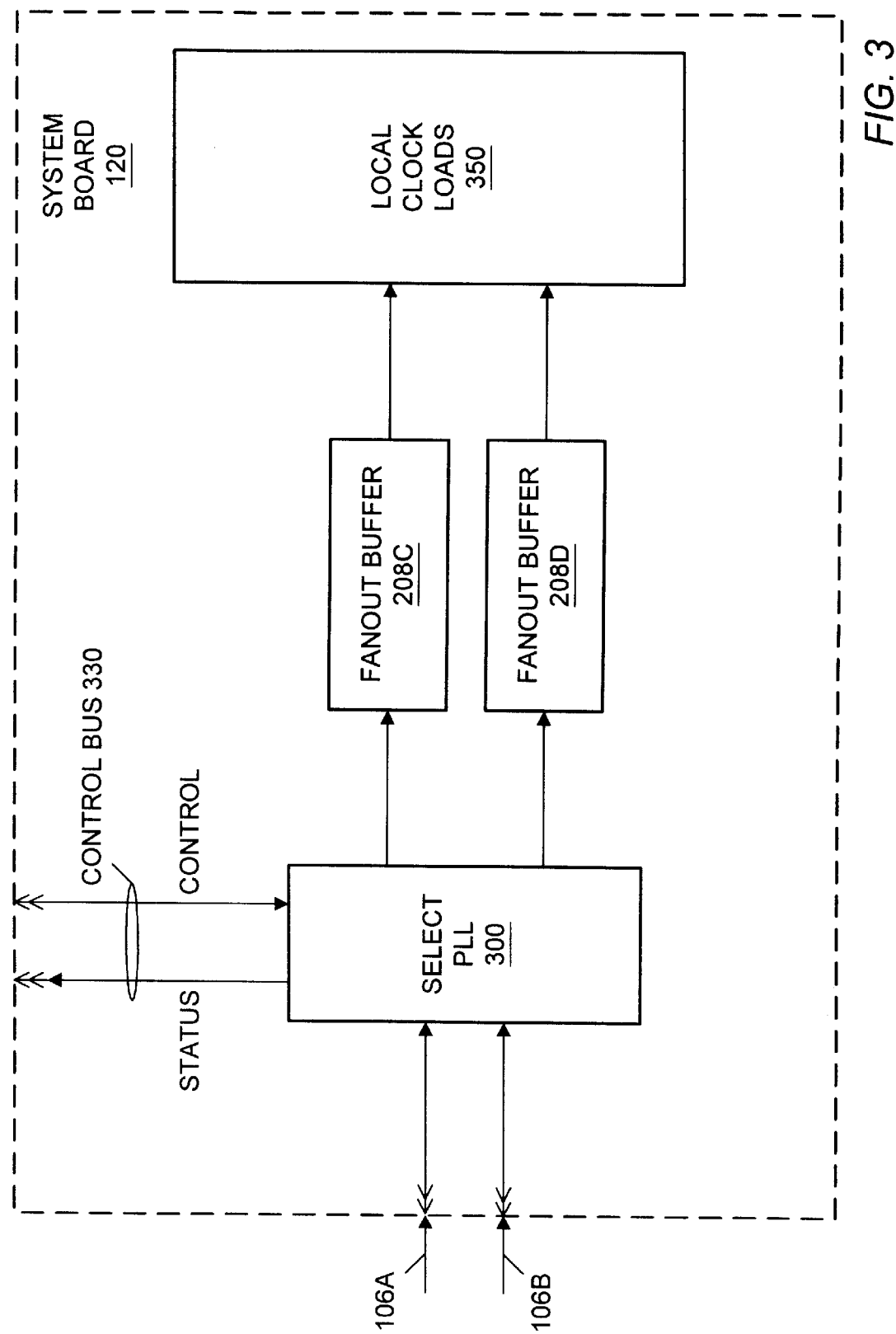
FIG. 3 is a block diagram of an embodiment of the system board of FIG. 1.

FIG. 3—System Board

FIG. 3 illustrates an embodiment of a system board 120. Clock signals 106A and 106B are provided to the system board 120 to a select PLL 300. The select PLL 300 is also coupled to receive status and control signals over control bus 330. Control bus 330 may be implemented as, for example, an I²C bus. The control bus 330 provides a communications pathway between the system controller 110 and the local control mechanisms of the select PLL 300.

The select PLL 300 produces a clock signal synchronized with the appropriate input clock signal 106. The select PLL 300 may output multiple clock signals at different frequencies. The output clock signals are provided to one or more fanout buffers, such as fanout buffers 208C and 208D, as shown. The fanout buffers 208C and 208D provide multiple local clock signals to the local clock loads 350. As shown, fanout buffer 208C provides a first clock frequency, such as 75 MHz, to selected ones of the local clock loads 350, while fanout buffer 208D provides a second clock frequency, such as 150 MHz, to other selected ones of the local clock loads 350.

It is noted that the local clock loads may include any device on the system board 120 that uses a local clock signal for synchronization or timing, including but not limited to synchronous logic, memory, and/or other electronic elements. It is further noted, that the system board 120 may be representative of any board or component in the computer system, such as an input/output board, memory sub-system, clock board, etc. In various embodiments, the system board is incorporated in a personal computer, a network computer, or a server computer, although other computer systems are also contemplated. Additional details of the operation of the select PLL 300 is shown below with respect to FIGS. 4–6.

Figure 4:
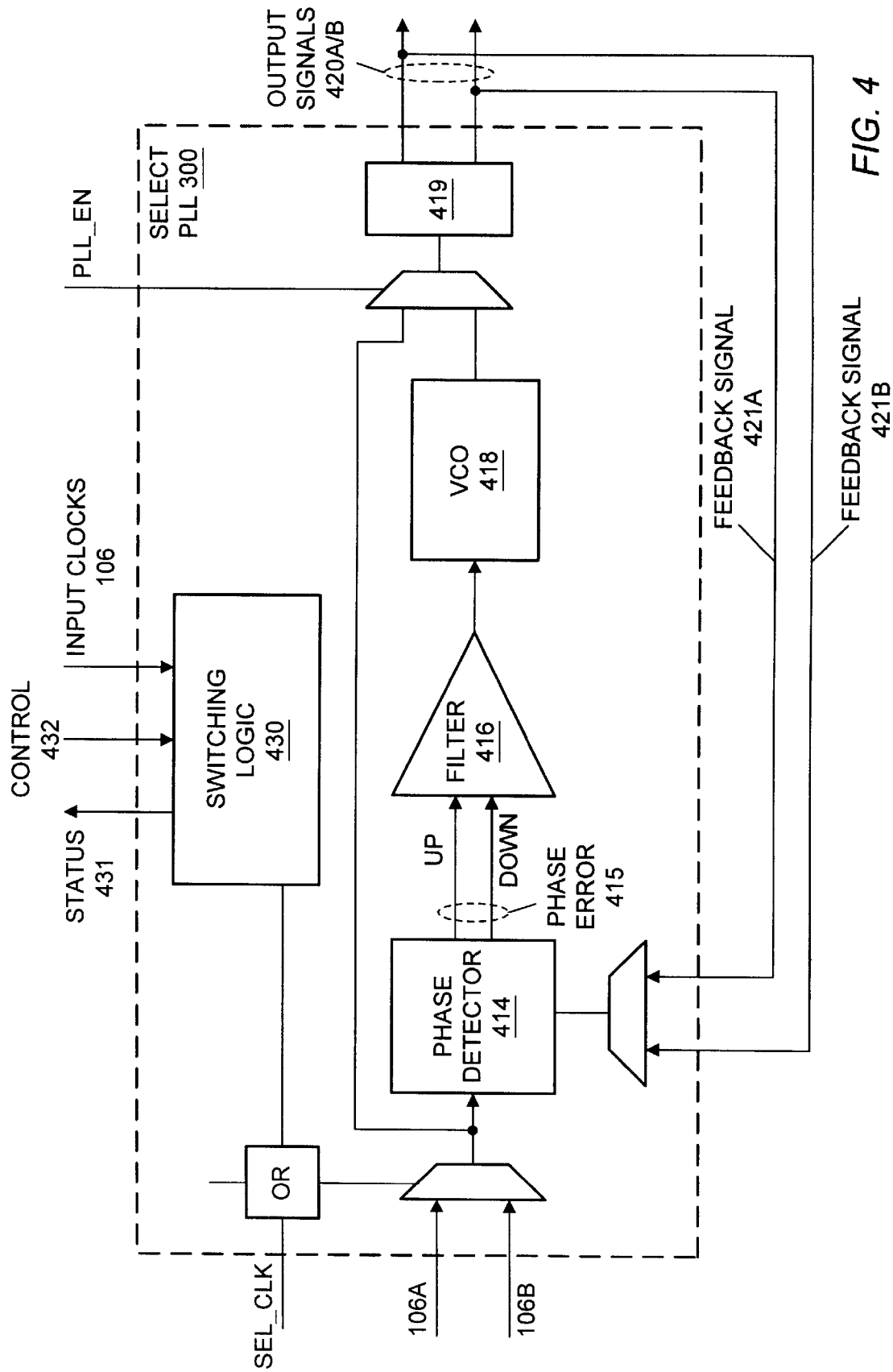
FIG. 4 is a block diagram of an embodiment of the select phase locked loop of FIG. 3.

FIG. 4—PLL with Switching Logic and Supplemental Error Correction

Turning to FIG. 4, a block diagram of a phase locked loop (PLL) circuit is illustrated. Preferably implemented as a monolithic integrated circuit, select PLL 300 includes a first multiplexer coupled to receive a first input clock signal 106A from the first clock source and the second input clock signal 106B from the second clock source. The multiplexer is controlled by a signal from an OR block coupled to receive a select clock input SEL_CLK and the output of switching logic 430. The select clock input sets the identity of the primary clock input. Switching logic 430 receives control inputs 432 and input clocks 106 and outputs status outputs 431.

The output of the input multiplexer is the input clock signal provided to the phase detector 414 and to an output multiplexer. The phase detector 414 receives the input clock signal 106 from the input multiplexer and a feedback signal 421 from a feedback multiplexer. The phase detector is configured to produce a phase error signal 415 indicative of the difference between the input clock signal 106 and the feedback signal 421. As shown, the phase error signal 415 comprises an UP pulse and a DOWN pulse, each preferably being digital signals. The UP pulse is indicative of a phase difference between the feedback signal 421 and the input clock signal 106 when an edge of the feedback signal 421 occurs after a corresponding edge of the input clock signal 106. The DOWN pulse is indicative of a phase difference between the feedback signal 421 and the input clock signal 106 when an edge of the feedback signal 421 occurs before a corresponding edge of the input clock signal 106.

A loop filter 416 is coupled to receive the phase error signal and to output an error correction signal to a voltage controller oscillator (VCO) 418. In a preferred embodiment, the loop filter comprises an active low-pass filter configured as an integrator. The VCO 418 is coupled to receive the error correction signal from the loop filter 416 and to produce oscillations indicative of the error correction signal. The oscillating signal is presented as a second input to the output multiplexer. A PLL enable signal PLL_EN is provided to provide either the output of the VCO 418 or the input clock signal 106A, 106B to output 420. In the illustrated embodiment, the output of the output multiplexer is multiplied or divided in a multiplier/divider circuit 419, such as by 1, 2, or 4, to produce one or more PLL output signals 420 A/B. The feedback signals 421A and 421B are shown coupled to the output signals of the PLL 420A/B.

Exemplary control signals 432, which may be input to the switching logic 430, include a reset signal and/or a manual override signal. Exemplary status signals 431 that may be output by the switching logic 430 include an indication signal of which input clock signal is selected and/or an indication signal if either or both input clock signals have failed. As an example, the select PLL 300 may be configured to use the second input clock 106B upon the failure of the first input clock 106A until the reset signal is received. The manual override signal would disable the switching logic 430 to enable manual selection of the input clock signal 106A or 106B to use as the local clock reference signal.

In one embodiment of the redundant clocking system, the switching logic 430 determines that the input clock 106A has failed and automatically switches over to the redundant backup clock 106B. The failover should take only a small number of clock cycles, ideally three or fewer. At some (preferably short) time following the failover, the system controller 110 may switch all other select PLLs 300 to the redundant backup clock 106B and also set the slave clock source 105B to master mode, if the master clock source 105A has failed. Clock switching is preferably automatic and does not interrupt or interfere with operation of the computer system. No halt and restart are necessary. The clock change is preferably transparent to the local clock loads using the local clock signal.

It is noted that in various embodiments, the switching logic 430 may also be configured to monitor the phase error signal 415 or other signals, as desired, in order to detect a failure of the input clock signal 106A, 106B or the feedback signal 421. Likewise, additional control signals 432 and status signals 431 are also contemplated. For example, status signals 431 may include a clock select signal indicating which input clock signal is currently the local master clock signal and input clock invalid signals indicating the failure of a particular input clock signal. Thus, before a failure, the clock selected could be input clock signal 106A and no input clock invalid signals are indicated. Upon a failure of input clock signal 106A, the clock select signal would indicate input clock signal 106B and the input clock invalid signal for input clock signal 106A would be indicated.

FIG. 5—Phase Detector

Turning now to FIG. 5, an embodiment of the phase detector 414 is illustrated. In FIG. 5, the input clock signal 106 and the feedback signal 421 are provided to phase comparison logic 520 of phase detector 414. The phase comparison logic 520 provides a signal indicative of the phase difference between the input clock signal 106 and the feedback signal 421 to output logic 530. The output logic 530 further receives the one or more status signals 431 and one or more control signals 432. In a preferred embodiment, as shown, the output logic 530 includes a supplemental correction pulse generator 535 and a pulse width limiting circuit 537. The output logic 530 provides the phase error signal 415 to the loop filter 416. It is noted that in the embodiment illustrated in FIG. 5, the phase error signal 415 comprises a digital UP signal and a digital DOWN signal.

Operation of one embodiment of the phase detector 414 is as follows. The input clock signal 106 and the feedback signal 421 are provided to the clock inputs of the phase comparison logic 520. The phase error signal includes one or more digital pulses, UP and/or DOWN, generated based on the phase difference between the input clock signal 106 and the feedback signal 421. A minimum UP and a minimum DOWN pulse may be generated upon a zero phase difference. The maximum pulse width for the UP and/or DOWN pulse is limited to a predetermined amount by the pulse width limiting circuit 537.

Upon the failure of the input clock signal 106, the supplemental correction pulse generator 535 is configured to output a maximum pulse, either UP or DOWN as appropriate, upon receiving notification of a failure of the input clock signal 106 from the present clock source. The notification may come from the switching logic 430, the system controller 110, and/or the phase detector 414 itself. In one embodiment, the supplemental correction pulse generator 535 includes a resettable one-shot. Other circuits capable of providing a pulse are also contemplated.

Figure 5A:
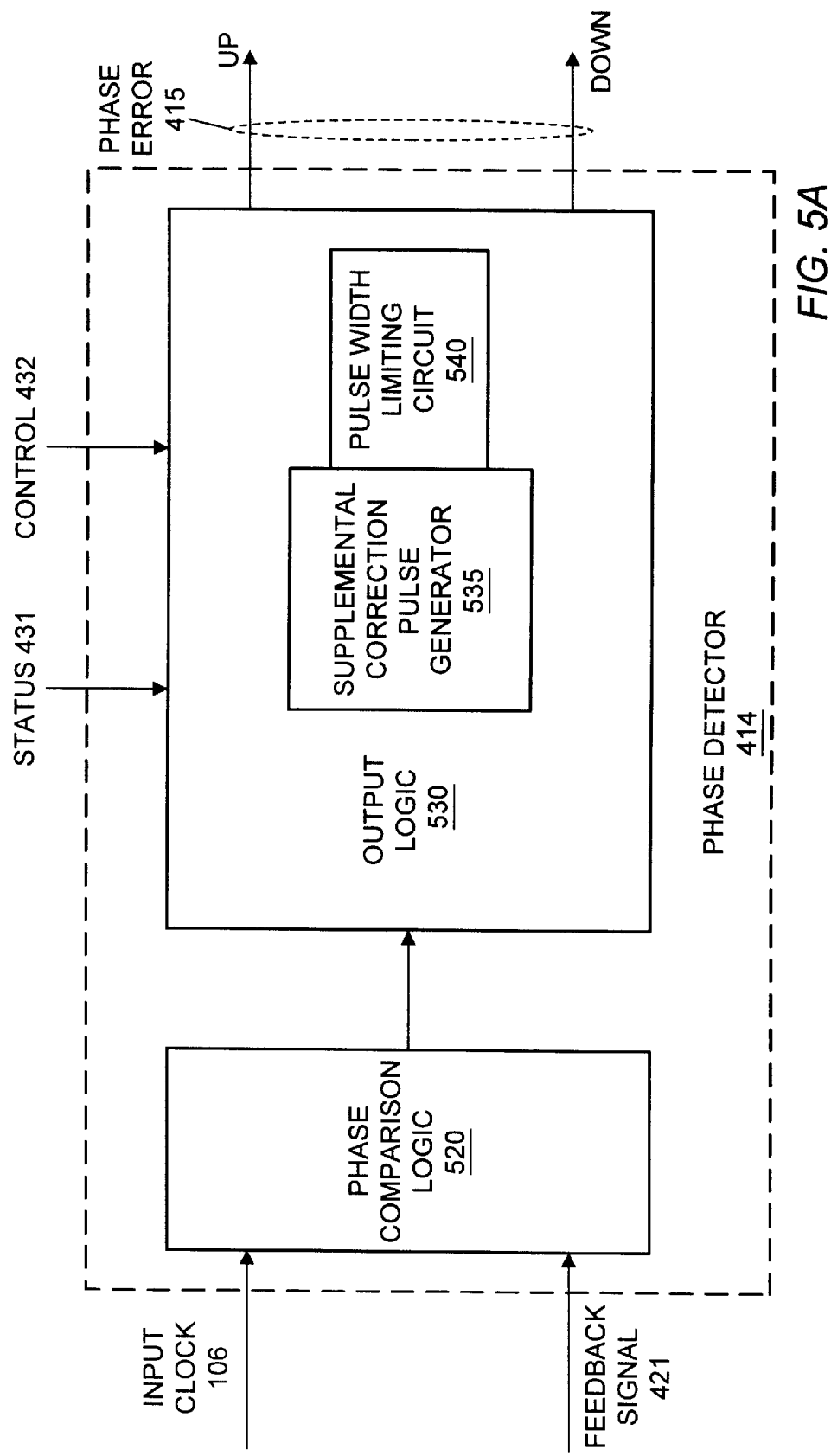
FIGS. 5A and 5B are block diagrams of embodiments of the phase detector of FIG. 4, which incorporates a supplemental correction pulse generator and a pulse limiting circuit.
Figure 5B:
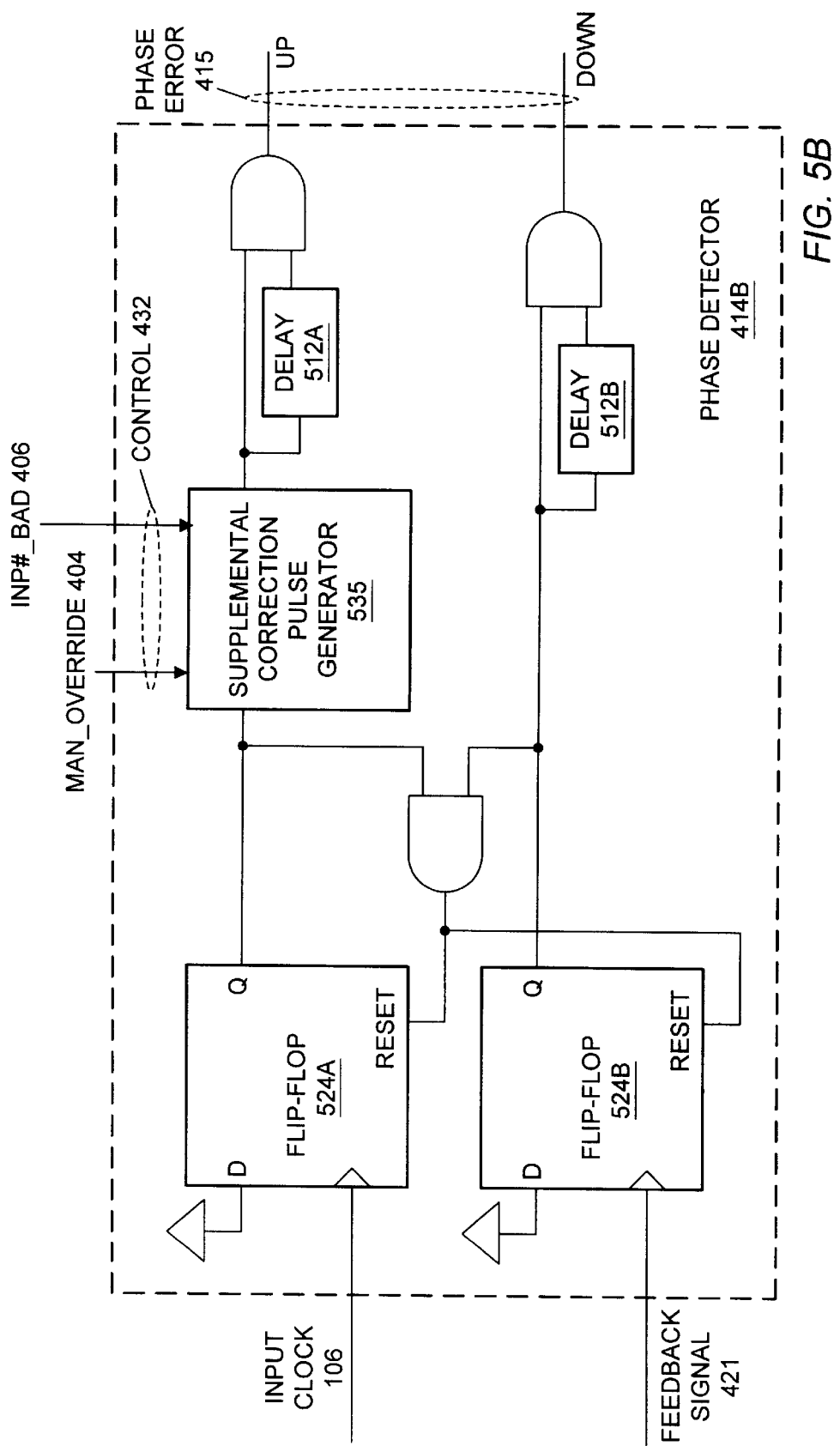

In FIG. 5B, one specific embodiment of phase detector 414 is shown as phase detector 414B. It is noted that a variety of circuits and components may be substituted for those shown, as suggested in FIG. 5A. The input clock signal 106 and the feedback signal 421 are provided to the clock inputs of a pair of flip-flops 524A and 524B, respectively, which have their data input lines held HIGH. Upon the receipt of a respective clock edge, the flip-flops 524A and 524B each output a logical "1". The output is maintained at logical "1" until both output lines are high. The output lines of the flip-flops 524A and 524B are combined by a logical AND, with the result provided to the RESET inputs of both flip-flops 524A and 524B. Thus, the flip-flops 524A and 524B reset when both flip-flops 524A and 524B output a logical "1". The outputs of the flip-flops 524A and 524B are provided to logical ANDs on the output of the phase detector 414B, both directly and through delay elements 512A and 512B, respectively.

The supplemental correction pulse generator 535 coupled in series on the UP side of the phase detector 414B is configured to output a maximum UP pulse upon receiving notification of a failure of the input clock signal 106 from the present clock source, either 106A or 106B. As shown, the supplemental correction pulse generator 535 also receives a manual override MAN_OVERRIDE signal 404 and the clock source failure notification signal(s) INP#_BAD 406 as control signals 432. It is noted that control signal INP#_BAD 406 may represent a plurality of signals, such as INP0_BAD, INP1_BAD, etc. In one embodiment, the supplemental correction pulse generator 535 includes a resettable one-shot. Other circuits capable of providing a pulse are also contemplated.

The output of the phase detector 414B includes the phase error signal 415 comprising in this embodiment, a digital UP pulse and a digital DOWN pulse. The UP pulse results from the clock edge of the input clock signal 106 being provided to the phase detector 414B ahead of the corresponding clock edge of the feedback signal 421. Thus, flip-flop 524A outputs a logical "1" before flip-flop 524B outputs a logical "1". The length of the UP pulse is limited by the pulse limitation of the delay 512A. The minimum and maximum pulse width of the UP pulse may be predetermined by the length of time of the delay provided by delay element 512A and by the reset time of the flip-flop 524A, relative to the clock period of the input clock signal 106. In a similar manner, the DOWN pulse results from the clock edge of the input clock signal 106 being provided to the phase detector 414B after the corresponding clock edge of the feedback signal 421. Thus, flip-flop 524B outputs a logical "1" before flip-flop 524A outputs a logical "1". The length of the DOWN pulse is limited by the pulse limitation of the delay 512B. The minimum and maximum pulse width of the DOWN pulse may be predetermined by the length of time of the delay provided by delay element 512B and by the reset time of the flip-flop 524B, relative to the clock period of the input clock signal 106.

It is noted that in a preferred implementation of phase detector 414B, at least a minimum UP pulse and a minimum DOWN pulse are generated for each rising edge of the input clock signal 106. It is also noted that the supplemental correction pulse generator 535 may also be located in series with the DOWN pulse or in series with both the UP pulse and the DOWN pulse. For example, in an embodiment with the supplemental correction pulse generator 535 in series with the DOWN pulse, a runaway input clock signal 106 is determined to have failed. The supplemental correction pulse generator 535 is notified of the failure and generates a maximum pulse width DOWN pulse.

Figure 6:
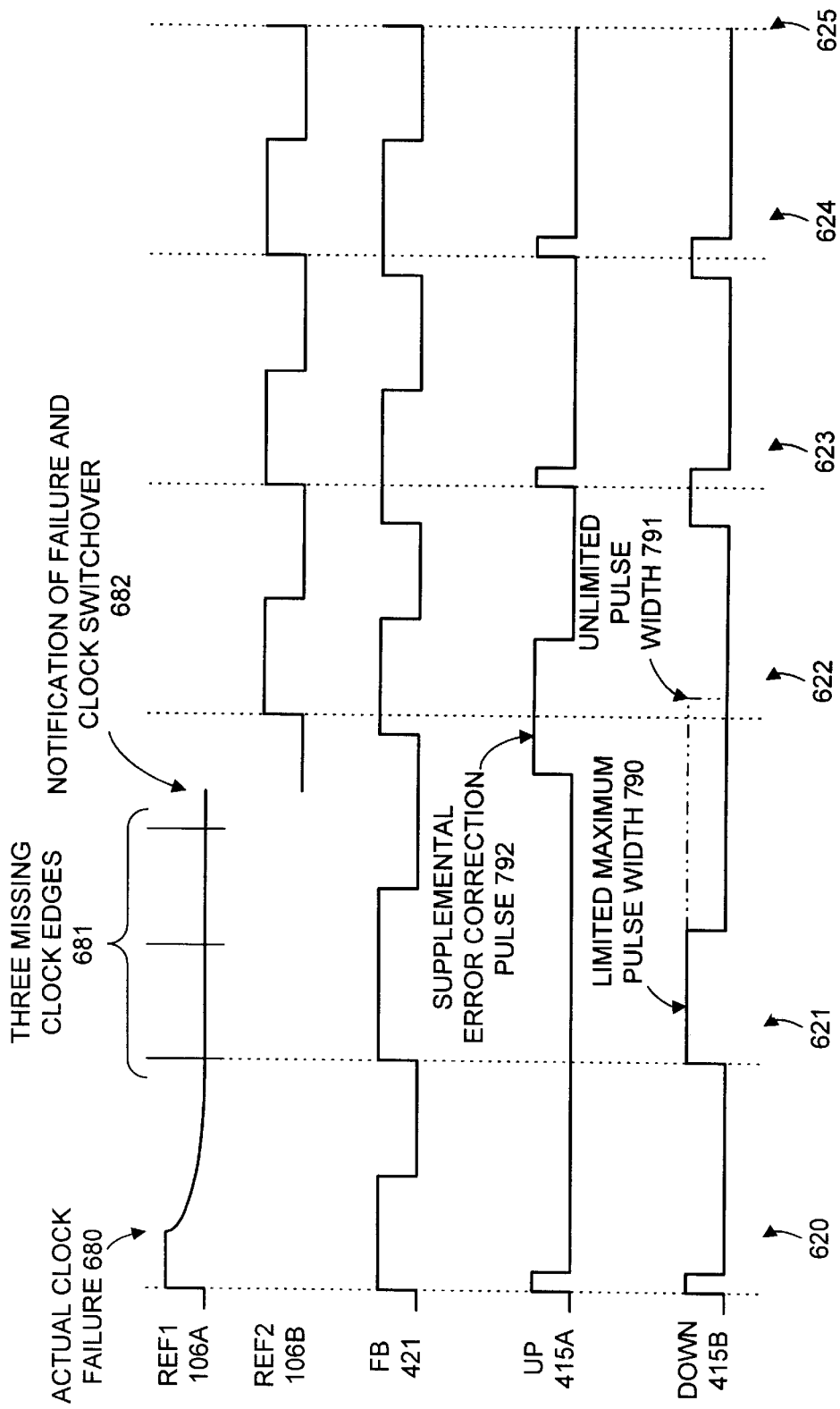
FIG. 6 is a timing diagram illustrating an embodiment of advanced operations of the select phase locked loop of FIG. 4, including switchover to a backup clock source, limited width phase error signal pulses, and a supplemental error correction pulse.

FIG. 6 Timing Diagram of Clock Signal Switchover

Examples of several advanced operations of the PLL 300 are illustrated in the timing diagram of FIG. 6. Switchover to a backup clock source, limited width phase error signal pulses, and a supplemental error correction pulse are illustrated. It is contemplated that a variety of embodiments of PLL circuits may be designed to operate as disclosed herein.

The first reference clock signal REF1 is shown as input clock signal 106A from the first clock source. The second reference clock signal REF2 is shown as input clock signal 106B from the second clock source. The feedback signal 421 and the input clock signal 106A are compared to produce the phase error signal. An UP pulse 415A and a DOWN pulse 415B are shown as comprising the response of the phase detector to the phase error signal.

In time period 620, the first input clock signal 106A and the feedback signal 421 are in phase. A minimum width UP pulse 415A and a minimum width DOWN pulse 415B are shown. Note that the first input clock signal 106A fails 680 during time period 620. The first input clock signal 106A is monitored for a failure. However, as shown, the failure may not be recognized until time period 621, when three clock edges are missed 681. It is also contemplated that the failure may be recognized earlier or later and the design of the phase detector 414 modified for those situations.

During clock period 621, with no input clock signal 106A being provided, the feedback signal 421 shows a longer period in response to the lack of an UP pulse 415A and the extremely wide DOWN pulse 415B. Note that the pulse width of the DOWN pulse 415B is limited to a predetermined maximum width 690. The unlimited pulse width is shown as 691. In addition, during clock period 621, the input clock source failure is recognized and the input clock is switched over to a second input clock source 106B in response. In addition, in response to the input clock failure, the supplemental error correction pulse 692 is injected as a maximum length UP pulse.

During clock period 622, the backup input clock signal 106B is now the reference clock signal. The supplemental error correction pulse 692 results in the feedback signal 421 having a shorter period than in clock period 621, closer to the correct phase alignment with the reference clock signal that would occur without the supplemental error correction pulse 692. Note that the missing UP pulse 415A from clock period 621 may occur in clock period 622. It is not seen in clock period 622 due to the supplemental error correction pulse 692. In one embodiment, the supplemental error correction pulse 692 is in addition to the UP pulse 415A. In another embodiment, the supplemental error correction pulse 692 replaces the UP pulse 415A.

During clock periods 623 and 624, the PLL circuit aligns the reference clock signal 106B and the feedback signal 421. Note that in clock period 625, the input clock signal 106B and the feedback signal 421 are in phase. It is noted that a failure of a clock source may be defined as the loss of as few as one clock edge, either rising or falling.

For the purposes of this disclosure, all clocking signals are assumed to be low voltage pseudo-ECL signals (LVPECL). Other types of clocking signals may be used as desired. With the clocking signals being LVPECL, with a CLK line and a $\overline{\text{CLK}}$ line, if one of the wires breaks, termination causes the broken line to be pulled high. Thus, there is never a crossing of the CLK and $\overline{\text{CLK}}$ lines, so no clock signal is output, e.g. a stuck clock signal.

Numerous variations and modifications will become apparent to those skilled in the art once the above disclosure is fully appreciated. It is intended that the following claims be interpreted to embrace all such variations and modifications.

What is claimed is:

1. A computer system, comprising:
    switching logic coupled to receive a first clock signal and a second clock signal, wherein said second clock signal is synchronous with said first clock signal, wherein said switching logic is configured to select either said first clock signal or said second clock signal as a local clock signal, wherein said switching logic is further configured to monitor said first clock signal for a failure, wherein if said failure of said first clock signal is detected by said switching logic, said switching logic is further configured to accept said second clock signal as said local clock signal in place of said first clock signal;
    one or more local clock loads that operate according to said local clock signal;
    a first clock source coupled to said switching logic and to said system controller, wherein said first clock source is configured to provide said first clock signal; and
    a second clock source coupled to said switching logic and to said system controller, wherein said second clock source is configured to provide said second clock signal, wherein said second clock source includes:
        a phase detector coupled to receive said first clock signal and said second clock signal, wherein said phase detector is configured to output an output signal indicative of a difference between said first clock signal and said second clock signal,
        a loop filter coupled to receive said output signal indicative of said difference, wherein said loop filter is configured to output a first control signal,
        a voltage controlled oscillator (VCO) coupled to receive said first control signal, wherein said VCO is configured to output said second clock signal in phase with said first clock signal, and
        a switch coupled to selectively cause either the first control signal or a fixed reference voltage to be provided to the VCO.

2. The computer system of claim 1, wherein said accept said second clock signal as said local clock signal in place of said first clock signal occurs automatically and does not interrupt or interfere with operations of said computer system.

3. The computer system of claim 1, further comprising:
    a system controller coupled to said switching logic, wherein said switching logic is further configured to notify said system controller of said failure.

4. The computer system of claim 3, wherein said system controller is further configured to notify a user of said computer system of said failure.

5. The computer system of claim 1, wherein said VCO is a voltage controlled crystal oscillator (VCXO).

6. The computer system of claim 5, wherein said VCXO is configured with a frequency operating range with a high fequency, a center frequency, and a low frequency, wherein a step function change in frequency between said high frequency and said center frequency is within an operating range of said local clock loads, and wherein said step function change in frequency between said low frequency and said center frequency is within said operating range of said local clock loads.

7. The system of claim 1, wherein said first clock source is configured as a master clock source, and wherein said second clock source is configured as a slave clock source, wherein upon a failure of said master clock source, said system controller is further configured to cause said slave clock source to fail-over and to take over as said master clock source, wherein said system controller causes said switch to provide said fixed reference voltage in place of said first control signal to the VCO in response to said slave clock source fail-over.

8. A computer system, comprising:
   a phase locked loop (PLL) coupled to receive a first clock signal and a second clock signal, wherein said second clock signal is synchronous with said first clock signal, wherein said PLL is configured to accept said first clock signal as an input clock signal, wherein said PLL is further configured to monitor said first clock signal for a failure, wherein if said failure of said first clock signal is monitored, said PLL is further configured to accept said second clock signal as said input clock signal in place of said first clock signal, and wherein said PLL outputs a local clock signal synchronized with said input clock signal;
   one or more local loads that operate according to said local clock signal; and
   a first clock source coupled to said PLL and to said system controller, wherein said first clock source is configured to provide said first clock signal; and
   a second clock source coupled to said PLL and to said system controller, wherein said second clock source is configured to provide said second clock signal, wherein said second clock source includes:
      a phase detector coupled to receive said first clock signal and said second clock signal, wherein said phase detector is configured to output an output signal indicative of a difference between said first clock signal and said second clock signal,
      a loop filter coupled to receive said output signal indicative of said difference, wherein said loop filter is configured to output a first control signal,
      a voltage controlled oscillator (VCO) coupled to receive said first control signal, wherein said VCO is configured to output said second clock signal in phase with said first clock signal, and
      a switch coupled to selectively cause either the first control signal or a fixed reference voltage to be provided to the VCO.

9. The computer system of claim 8, wherein said accept said second clock signal as said local clock signal in place of said first clock signal occurs automatically and does not interrupt or interfere with operations of said computer system.

10. The computer system of claim 8, further comprising:
    a system controller coupled to said PLL, wherein said PLL is further configured to notify said system controller of said failure.

11. The computer system of claim 10, wherein said system controller is further configured to notify a user of said computer system of said failure.

12. The computer system of claim 8, wherein said VCO is a voltage controlled crystal oscillator (VCXO).

13. The computer system of claim 12, wherein said VCXO is configured with a frequency operating range with a high frequency, a center frequency, and a low frequency, wherein a step function change in frequency between said high frequency and said center frequency is within an operating range of said local clock loads, and wherein said step function change in frequency between said low frequency and said center frequency is within said operating range of said local clock loads.

14. The system of claim 8, wherein said first clock source is configured as a master clock source, and wherein said second clock source is configured as a slave clock source, wherein upon a failure of said master clock source, said system controller is further configured to cause said slave clock source to fail-over and to take over as said master clock source, wherein said system controller causes said switch to provide said fixed reference voltage in place of said first control signal to said VCO in response to said slave clock source fail-over.

* * * * *